(12) United States Patent
Nakano et al.

(10) Patent No.: US 8,994,020 B2
(45) Date of Patent: Mar. 31, 2015

(54) THIN FILM TRANSISTOR WITH CHANNEL PROTECTION FILM OF SPECIFIC RESISTIVITY

(71) Applicant: Kabushiki Kaisha Toshiba, Tokyo (JP)

(72) Inventors: Shintaro Nakano, Kanagawa-ken (JP); Kentaro Miura, Kanagawa-ken (JP); Nobuyoshi Saito, Tokyo (JP); Tatsunori Sakano, Kanagawa-ken (JP); Tomomasa Ueda, Kanagawa-ken (JP); Hajime Yamaguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/799,565

(22) Filed: Mar. 13, 2013

(65) Prior Publication Data

US 2014/0084284 A1     Mar. 27, 2014

(30) Foreign Application Priority Data

Sep. 26, 2012     (JP) ................................ 2012-213081

(51) Int. Cl.
H01L 29/786     (2006.01)

(52) U.S. Cl.
CPC .................................. *H01L 29/7869* (2013.01)
USPC .......................................................... 257/43

(58) Field of Classification Search
USPC ............................................. 257/43, 57, 649
See application file for complete search history.

(56) References Cited

U.S. PATENT DOCUMENTS

| | | | |
|---|---|---|---|
| 2007/0040954 A1* | 2/2007 | Lee et al. | 349/43 |
| 2008/0299702 A1* | 12/2008 | Son et al. | 438/104 |
| 2011/0133179 A1 | 6/2011 | Yamazaki | |
| 2011/0254068 A1* | 10/2011 | Kitakado et al. | 257/296 |
| 2013/0023086 A1 | 1/2013 | Chikama et al. | |
| 2013/0237013 A1 | 9/2013 | Yamazaki | |

FOREIGN PATENT DOCUMENTS

| | | |
|---|---|---|
| JP | 2004-103957 | 4/2004 |
| JP | 2011-142309 A1 | 7/2011 |
| WO | 2011/077607 A1 | 6/2011 |

OTHER PUBLICATIONS

Landford et al., "The hydrogen content of plasma deposited silicon nitride", Journal of Applied Physics 49, 2473 (1978).*
Nobuyoshi Saito, et al., "Amorphous In—Ga—Zn—Oxide TFTs with High Stability against Bias Temperature Stress", IDW '10, 2010, 4 pages.
Office Action issued Aug. 22, 2014 in JP Patent Application No. 2012-213081 with English translation.

* cited by examiner

*Primary Examiner* — Thomas L Dickey
(74) *Attorney, Agent, or Firm* — Oblon, McClelland, Maier & Neustadt, L.L.P.

(57) ABSTRACT

According to one embodiment, a display device includes a thin film transistor. The thin film transistor includes a gate insulating film, a semiconductor layer, a gate electrode, first and second channel protection films, first and second conductive layers, and a passivation film. The semiconductor layer is provided on a major surface of the gate insulating film. The semiconductor layer includes first to seventh portions. The gate insulating film is disposed between the semiconductor layer and the gate electrode. The first channel protection film covers the third portion. The second channel protection film covers the fifth and fourth portions, and an upper surface of the first channel protection film. The first conductive layer covers the sixth portion. The second conductive layer covers the seventh portion. The passivation film covers the first and second portions, the first and second conductive layers, and the second channel protection film.

18 Claims, 13 Drawing Sheets

THIN FILM TRANSISTOR WITH CHANNEL PROTECTION FILM OF SPECIFIC RESISTIVITY

CROSS-REFERENCE TO RELATED APPLICATIONS

This application is based upon and claims the benefit of priority from the prior Japanese Patent Application No.2012-213081, filed on Sep. 26, 2012; the entire contents of which are incorporated herein by reference.

FIELD

Embodiments described herein relate generally to a thin film transistor and a display device.

BACKGROUND

Thin film transistors (TFTs) are widely used in liquid crystal display devices, organic electroluminescence (EL) display devices, etc.

Amorphous silicon TFTs used in large display devices have a mobility of about 1 cm$^2$/V·s, can be formed by plasma CVD (Chemical Vapor Deposition), and therefore can be formed uniformly and inexpensively over a large surface area.

Low-temperature polysilicon TFTs used in small-to-mid-sized display devices have a mobility of about 100 cm$^2$/V·s and have high reliability when operated for a long period of time.

In recent years, TFTs having higher reliability are desirable. Therefore, oxide semiconductors used as the semiconductor layer material of TFTs are drawing attention.

DETAILED DESCRIPTION

Figure 1:
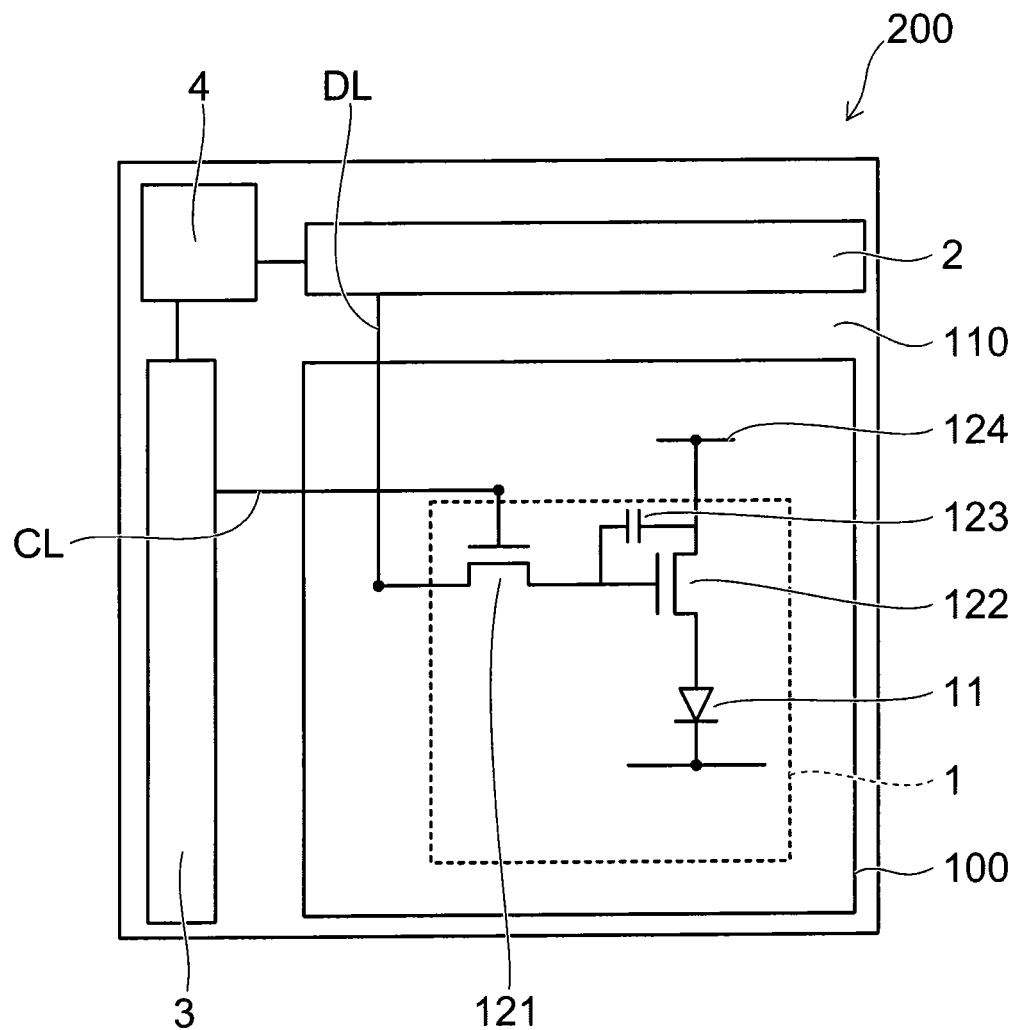
FIG. 1 is a plan view showing a display device according to a first embodiment.

According to one embodiment, a display device includes a thin film transistor. The thin film transistor includes a gate insulating film, a semiconductor layer, a gate electrode, a first channel protection film, a second channel protection film, a first conductive layer, a second conductive layer, and a passivation film. The gate insulating film has a major surface. The semiconductor layer is provided on a portion of the major surface. The semiconductor layer includes a first portion, a second portion separated from the first portion in a plane parallel to the major surface, a third portion provided between the first portion and the second portion, a fourth portion provided between the first portion and the third portion, a fifth portion provided between the second portion and the third portion, a sixth portion provided between the first portion and the fourth portion, and a seventh portion provided between the second portion and the fifth portion. The gate insulating film is disposed between the semiconductor layer and the gate electrode. The first channel protection film covers the third portion of the semiconductor layer. The second channel protection film covers the fifth portion, the fourth portion, and an upper surface of the first channel protection film. The first conductive layer covers the sixth portion. A portion of the second channel protection film is disposed between the first conductive layer and the fourth portion. The second conductive layer covers the seventh portion. A portion of the second channel protection film is disposed between the second conductive layer and the fifth portion. The passivation film covers the first portion, the second portion, the first conductive layer, the second conductive layer, and the second channel protection film. The passivation film includes not less than $1.0\times10^{20}$ atoms/cm$^3$ of hydrogen.

According to one embodiment, a thin film transistor includes a gate insulating film, a semiconductor layer, a gate electrode, a first channel protection film, a second channel protection film, a first conductive layer, a second conductive layer, and a passivation film. The gate insulating film has a major surface. The semiconductor layer is provided on a portion of the major surface. The semiconductor layer includes a first portion, a second portion separated from the first portion in a plane parallel to the major surface, a third portion provided between the first portion and the second portion, a fourth portion provided between the first portion and the third portion, a fifth portion provided between the second portion and the third portion, a sixth portion provided between the first portion and the fourth portion, and a seventh portion provided between the second portion and the fifth portion. The gate insulating film is disposed between the semiconductor layer and the gate electrode. The first channel protection film covers the third portion of the semiconductor layer. The second channel protection film covers the fifth portion, the fourth portion, and an upper surface of the first channel protection film. The first conductive layer covers the sixth portion. A portion of the second channel protection film is disposed between the first conductive layer and the fourth portion. The second conductive layer covers the seventh portion. A portion of the second channel protection film is disposed between the second conductive layer and the fifth portion. The passivation film covers the first portion, the second portion, the first conductive layer, the second conductive layer, and the second channel protection film. The passivation film includes not less than $1.0\times10^{20}$ atoms/cm$^3$ of hydrogen.

Oxide semiconductors are drawing attention as semiconductor materials having high reliability to be used in thin film transistors (TFTs). For example, oxide semiconductors such as indium gallium zinc oxide (In—Ga—Zn—O (hereinbelow, IGZO)), etc., are drawing attention. Oxide semiconductors can be formed uniformly in a film over a large surface area at room temperature by, for example, sputtering and are transparent in the visible region. Accordingly, a TFT using such an oxide semiconductor can be formed on a plastic film substrate having low thermal stability; and it is possible to form a flexible display device using such a TFT. Such an oxide semiconductor has a high field effect mobility that is about 10 times that of amorphous silicon. Also, high reliability in a BTS (Bias Temperature Stress) test can be obtained by performing high-temperature post anneal of the oxide semiconductor at 300° C. to 400° C. Thus, TFTs using oxide semiconductors are the leading candidate for the next-generation backplane element of display devices because oxide semiconductors have high uniformity, high field effect mobility, and low manufacturing costs.

However, in the case where a thin film transistor using an oxide semiconductor is formed using low-temperature processes, it is desirable to increase the reliability.

Embodiments of the invention will now be described in detail with reference to the drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a plan view showing a display device according to a first embodiment. Although the display device may include an organic EL display device or a liquid crystal display device, an active-matrix organic EL display device 200 is described herein. The organic EL display device 200 includes multiple pixel units 1 disposed in a matrix configuration in a display region. FIG. 1 shows one enlarged pixel unit 1. The organic EL display device 200 includes a display region 100 in which the multiple pixel units 1 are disposed, and a peripheral region 110 which is a region other than the display region 100.

A signal line drive circuit 2, a control line drive circuit 3, and a controller 4 are provided in the peripheral region 110. The controller 4 is connected to the signal line drive circuit 2 and the control line drive circuit 3. The controller 4 performs the timing control of the operation of the signal line drive circuit 2 and the operation of the control line drive circuit 3.

The signal line drive circuit 2 and the pixel units 1 are connected by multiple signal lines DL that are provided along the column direction in the drawing. The control line drive circuit 3 and the pixel units 1 are connected by multiple control lines CL that are provided along the row direction in the drawing. The signal line drive circuit 2 supplies signal voltages corresponding to image signals to the pixel units 1 via the signal lines DL. The control line drive circuit 3 supplies scanning line drive signals to the pixel units 1 via the control lines CL.

The pixel unit 1 includes a capacitor 123, a drive TFT 122, a write TFT 121, and an organic EL element 11 that emits light according to the current that is supplied. The write TFT 121 and the drive transistor 122 are back gate-type TFTs. The signal line DL is connected to the source electrode of the write TFT 121; and the control line CL is connected to the gate electrode of the write TFT 121. The drain electrode of the write TFT 121 is connected to the gate electrode of the drive TFT 122.

The organic EL element includes an organic EL layer, an anode electrode, and a cathode electrode. The source electrode of the drive TFT 122 is connected to the anode electrode of the organic EL element 11. A power supply line 124 is connected to the drain electrode of the drive TFT 122 to supply a positive power supply voltage Vdd. The capacitor 123 is connected between the drain electrode of the write TFT 121 and the drain electrode of the drive TFT 122. The voltage of the cathode electrode of the organic EL element 11 is set to be Vss. For example, the configuration of the write TFT 121 is the same as the configuration of the drive TFT 122.

Figure 2:
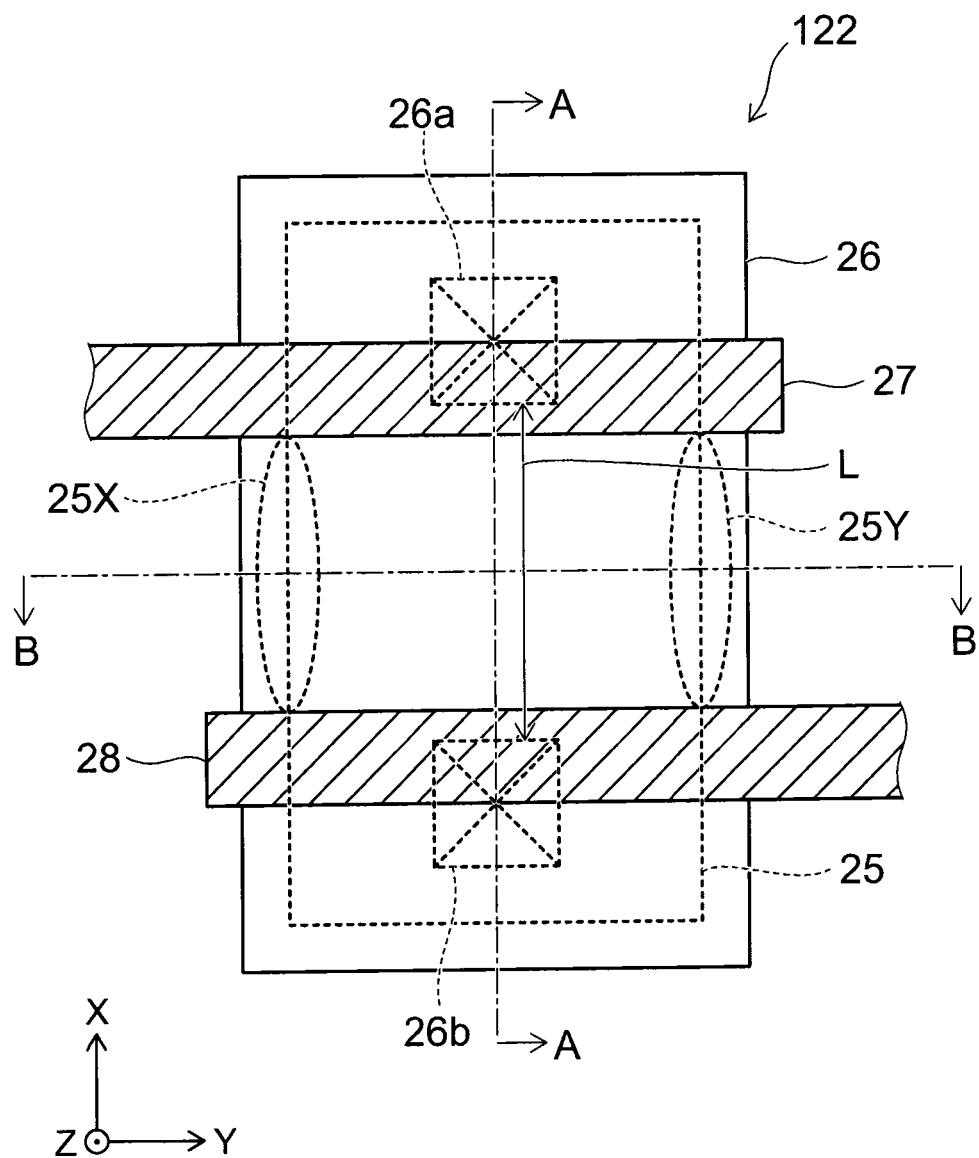
FIG. 2 is a plan view showing a thin film transistor according to the first embodiment.
Figure 3:
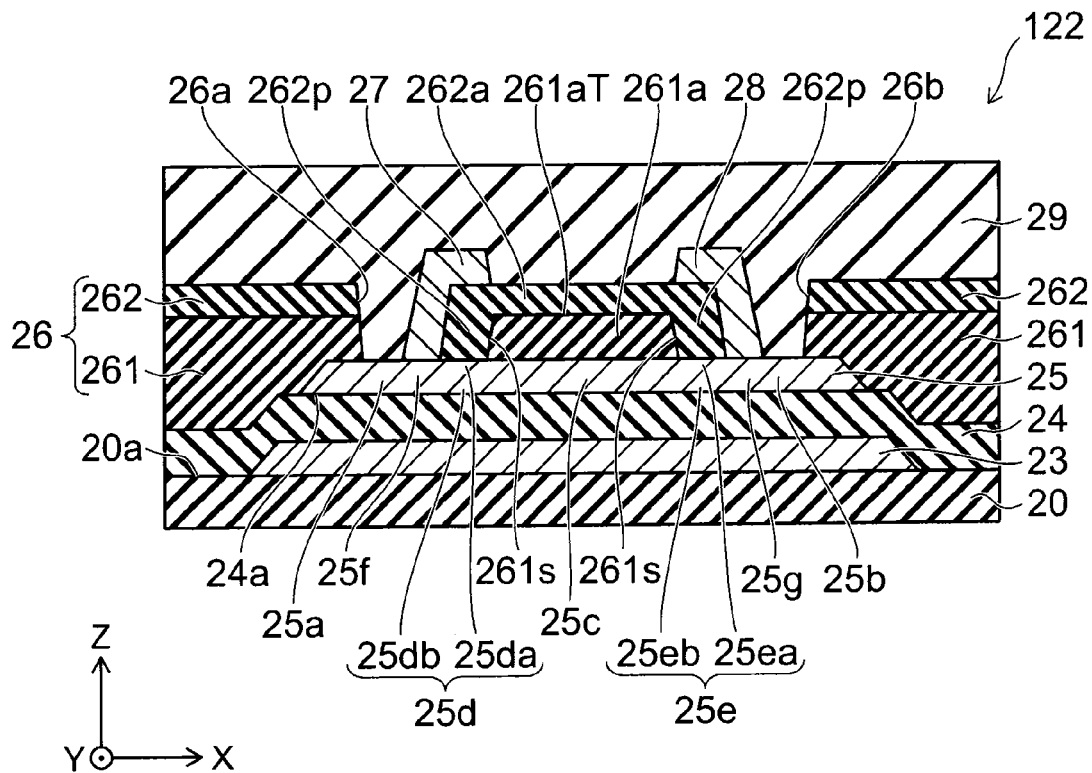
FIG. 3 is a cross-sectional view showing the thin film transistor according to the first embodiment.
Figure 4:
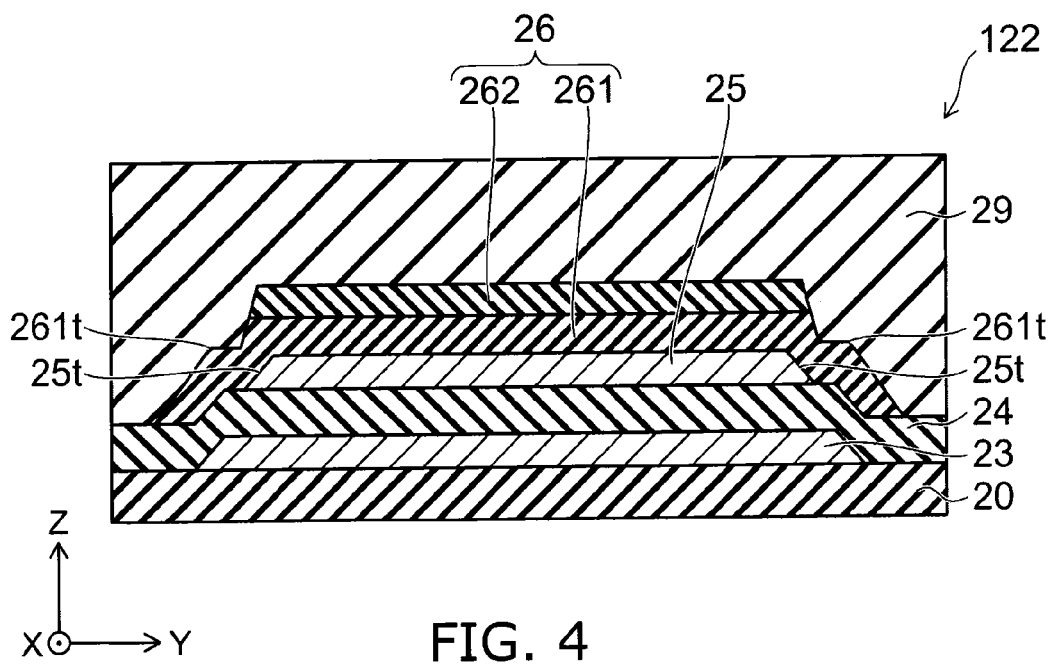
FIG. 4 is another cross-sectional view showing the thin film transistor according to the first embodiment.

An example of the drive TFT 122 will now be described using FIG. 2 to FIG. 4. FIG. 2 is a plan view showing the drive TFT according to the first embodiment. FIG. 3 is a cross-sectional view showing the drive TFT according to the first embodiment. The cross-sectional view of FIG. 3 shows a cross section along line A-A of FIG. 2. FIG. 4 is another cross-sectional view showing the drive TFT according to the first embodiment. The cross-sectional view of FIG. 4 shows a cross section along line B-B of FIG. 2.

The drive TFT 122 includes a first conductive layer 27, a second conductive layer 28, a gate electrode 23, a gate insulating film 24, a semiconductor layer 25, a channel protection film 26, and a passivation film 29.

The gate electrode 23 is provided on a portion of a substrate 20. The gate electrode 23 may include, for example, a refractory metal such as molybdenum-tungsten (MoW), molybdenum-tantalum (MoTa), tungsten (W), etc. The gate electrode 23 may include an Al alloy having a main component of aluminum (Al) for which hillock-preventing measures are performed; and a stacked film of Al and a refractory metal may be used. The substrate 20 has a major surface 20a (referring to FIG. 3). The gate electrode 23 is provided on the major surface 20a. A direction perpendicular to the major surface 20a of the substrate 20 where the gate electrode 23 is provided is taken as a Z direction. One direction parallel to the major surface 20a of the substrate 20 is taken as an X direction. A direction parallel to the major surface 20a of the substrate 20 and perpendicular to the X direction is taken as a Y direction. The substrate 20, the gate electrode 23, and the gate insulating film 24 are stacked along the Z direction.

The gate insulating film 24 is provided on the gate electrode 23. In the example, the gate insulating film 24 is provided over the entire substrate 20 while covering the gate electrode 23. The gate insulating film 24 has one major surface 24a. The one major surface 24a is parallel to the XY plane. The gate insulating film 24 may include, for example, a material that is insulative and light-transmissive. The gate insulating film 24 includes an insulating material. The gate insulating film 24 includes at least one selected from silicon oxide, silicon nitride, silicon oxynitride, and aluminum oxide. The gate insulating film 24 may include, for example, a silicon oxide film ($SiO_x$, where x is any positive value), a silicon nitride film ($SiN_x$), a silicon oxynitride film (SiON), or an alumina film ($Al_2O_3$). The gate insulating film 24 may include a stacked film of these films.

The semiconductor layer 25 is provided on the one major surface 24a of the gate insulating film 24. The gate insulating film 24 is provided between the gate electrode 23 and the semiconductor layer 25 to insulate the gate electrode 23 from the semiconductor layer 25. In other words, the gate electrode 23 opposes the semiconductor layer 25 with the gate insulating film 24 interposed. The semiconductor layer 25 may include, for example, an oxide semiconductor including at least one selected from indium (In), gallium (Ga), and zinc (Zn). In other words, the semiconductor layer 25 may include, for example, one selected from an In—Ga—Zn—O oxide semiconductor, an In—Ga—O oxide semiconductor, and an In—Zn—O oxide semiconductor. The oxide semiconductor may be in an amorphous state or in a polycrystalline state. An oxide semiconductor in the amorphous state is used in the embodiment. The semiconductor layer 25 may be a p type, an n type, CMOS, etc. The film thickness of the semiconductor layer 25 is, for example, not less than 5 nm and not more than 100 nm; and it is favorable for the film thickness of the semiconductor layer 25 to be not less than 5 nm and not more than 20 nm. Considering the electrical characteristics, the film thickness of the semiconductor layer 25 may be, for example, about 10 nm.

A diffraction pattern indicating the crystallinity or the like is not observed for the semiconductor layer 25 including the amorphous oxide semiconductor when observed by transmission electron microscopy (TEM) or X-ray diffraction (XRD). The film quality and configuration of the semiconductor layer 25 can be observed by scanning electron microscopy (SEM), TEM, etc.

The semiconductor layer 25 may include a material in which the microcrystals of the oxide semiconductor recited above are dispersed in the amorphous oxide semiconductor recited above.

The channel protection film 26 is provided on the semiconductor layer 25. The channel protection film 26 is provided to cover the semiconductor layer 25 and the gate insulating film 24. The channel protection film 26 includes a first channel protection film 261 and a second channel protection film 262. The first channel protection film 261 is provided to cover the semiconductor layer 25 and the gate insulating film 24. The second channel protection film 262 is provided on the first channel protection film 261. The first channel protection film 261 and the second channel protection film 262 protect the semiconductor layer 25.

The first channel protection film 261 and the second channel protection film 262 include at least one selected from silicon oxide, silicon nitride, silicon oxynitride, and aluminum oxide. The first channel protection film 261 and the second channel protection film 262 may include, for example, an insulating material such as a silicon oxide film ($SiO_x$, where x is any positive value), a silicon nitride film ($SiN_x$), a silicon oxynitride film (SiON), an alumina film ($Al_2O_3$), etc. The first channel protection film 261 includes, for example, an insulating material containing oxygen such as silicon oxide, etc., that has an acid resistance that is higher than that of the semiconductor layer 25. The second channel protection film 262 also includes silicon oxide, etc., that has an acid resistance that is higher than that of the semiconductor layer 25. The second channel protection film 262 is a film having a higher degree of oxidation than the first channel protection film 261. In other words, the second channel protection film 262 contains more oxygen atoms than the first channel protection film 261. For example, the oxygen concentration of the second channel protection film 262 is higher than the oxygen concentration of the first channel protection film 261. For example, the ratio of the number of the oxygen atoms to the number of the silicon atoms of the second channel protection film 262 is higher than the ratio of the number of the oxygen atoms to the number of the silicon atoms of the first channel protection film 261.

The channel protection film 26 has a first opening 26a and a second opening 26b. The first opening 26a and the second opening 26b are provided, for example, to oppose each other along the X direction. As shown in FIG. 3, the first opening 26a and the second opening 26b expose a portion of the semiconductor layer 25. A portion 261a of the first channel protection film and a portion 262a of the second channel protection film are provided between the first opening 26a and the second opening 26b in the X direction. A side surface 261s of the first channel protection film on the side of the first opening 26a opposing the second opening 26b is covered with the portion 262a of the second channel protection film. The side surface 261s of the first channel protection film on the side of the second opening 26b opposing the first opening 26a is covered with the portion 262a of the second channel protection film.

As shown in FIG. 4, a side surface 25t of the semiconductor layer 25 in the Y direction is covered with the first channel protection film 261. A side surface 261t of the first channel protection film 261 in the Y direction is exposed from the second channel protection film 262.

The first conductive layer 27 is provided in a portion of the first opening 26a. The first conductive layer 27 also covers a portion 262p of the second channel protection film on the first opening 26a side. The second conductive layer 28 is provided in a portion of the second opening 26b. The second conductive layer 28 also covers the portion 262p of the second channel protection film on the second opening 26b side. The first conductive layer 27 and the second conductive layer 28 oppose each other with the channel protection film 26 interposed in the X direction.

The first conductive layer 27 is electrically connected to the semiconductor layer 25. The second conductive layer 28 is electrically connected to the semiconductor layer 25. The first conductive layer 27 and the second conductive layer 28 may include, for example, titanium (Ti), Al, Mo, etc. The first conductive layer 27 and the second conductive layer 28 may include, for example, a stacked body including at least one selected from Ti, Al, and Mo. The first conductive layer 27 and the second conductive layer 28 may be indium tin oxide (ITO). Or, the first conductive layer 27 and the second conductive layer 28 may be portions having low resistances by performing argon (Ar) plasma processing of a portion of the semiconductor layer 25 not covered with the channel protection film 26. The first conductive layer 27 is one selected from the source electrode and the drain electrode of the drive TFT 122. The second conductive layer 28 is the other selected from the source electrode and the drain electrode of the drive TFT 122. In the embodiment, the first conductive layer 27 is the drain electrode; and the second conductive layer 28 is the source electrode.

The first conductive layer 27, the second conductive layer 28, the protection film 26, the first opening 26a, and the second opening 26b are covered with the passivation film 29. As shown in FIG. 3, a portion 262a of the second channel protection film that is provided between the first conductive layer 27 and the second conductive layer 28 in the X direction is covered with the passivation film 29. As shown in FIG. 4, the side surface 261t of the first channel protection film 261 that is exposed from the second channel protection film 262 in the Y direction is covered with the passivation film 29. A portion of the semiconductor layer 25 contacts the passivation film 29 via the openings 26a and 26b of the channel protection film 26. The passivation film 29 may include, for example, a material that is insulative and light-transmissive. The passivation film 29 may include, for example, one selected from silicon oxide, silicon nitride, and silicon oxynitride. The passivation film 29 may include, for example, one selected from a silicon oxide film, a silicon nitride film, and a silicon oxynitride film. The passivation film 29 includes hydrogen. The passivation film 29 contains, for example, not less than $1.0 \times 10^{20}$ atoms/cm$^3$ of hydrogen.

When a voltage is applied to the gate electrode 23, a channel forms in the semiconductor layer 25; and a current flows between the first conductive layer 27 and the second conductive layer 28.

As shown in FIG. 3, the semiconductor layer 25 includes a first portion 25a, a second portion 25b opposing the first portion 25a in the X direction, a third portion 25c provided between the first portion 25a and the second portion 25b, a fourth portion 25d provided between the first portion 25a and the third portion 25c, a fifth portion 25e provided between the second portion 25b and the third portion 25c, a sixth portion 25f provided between the first portion 25a and the fourth portion 25d, and a seventh portion 25g provided between the second portion 25b and the fifth portion 25e.

The first channel protection film 261 covers the third portion 25c of the semiconductor layer 25. The second channel protection film 262 covers an upper surface 261aT of the first channel protection film 261, the fourth portion 25d of the semiconductor layer 25, and the fifth portion 25e of the semiconductor layer 25. The first conductive layer 27 covers the sixth portion 25f while opposing the fourth portion 25d of the semiconductor layer 25 with the second channel protection film 262 interposed. The second conductive layer 28 covers the seventh portion 25g while opposing the fifth portion 25e of the semiconductor layer 25 with the second channel protection film 262 interposed. The passivation film 29 covers the second channel protection film 262, the second conductive layer 28, the first conductive layer 27, the second portion 25b of the semiconductor layer 25, and the first portion 25a of the semiconductor layer 25.

The resistance of the semiconductor layer 25 made of the oxide semiconductor changes due to the degree of oxidation of the film covering the upper surface of the semiconductor layer 25. The resistance of the semiconductor layer 25 decreases when covered with a film having a low degree of oxidation. On the other hand, the resistance of the semiconductor layer 25 increases when covered with a film having a high degree of oxidation.

The resistance of the third portion 25c of the semiconductor layer 25 that is covered with the first channel protection film 261 is lower than those of the fourth portion 25d and the fifth portion 25e that are covered with the second channel protection film 262. The field effect mobility of the drive TFT 122 can be increased by reducing the resistance of the third portion 25c.

Portions 25da and 25ea of the fourth portion 25d and the fifth portion 25e of the semiconductor layer 25 that are proximal to the second channel protection film 262 have relatively high resistances. Generally, there are cases where the resistance of a portion of the semiconductor layer undesirably decreases too much and no longer functions as an active layer in the case where the drain electrode opposes the portion of the semiconductor layer with an interposed channel protection film having a low degree of oxidation. However, in the embodiment, the first conductive layer 27 which is the drain electrode opposes the fourth portion 25d of the semiconductor layer 25 with the second channel protection film 262, which has a high degree of oxidation, being interposed. Accordingly, such a problem does not occur easily because the portion 25da of the fourth portion 25d which is proximal to the second channel protection film 262 has a high resistance.

The hydrogen included in the passivation film 29 easily diffuses into the semiconductor layer 25 because the semiconductor layer 25 and the passivation film 29 contact each other via the opening 26a. In particular, the resistance of the fourth portion 25d is not easily reduced in the case where the hydrogen inside the passivation film 29 is supplied to the fourth portion 25d of the semiconductor layer 25.

Thus, for the semiconductor layer 25, the resistance of the fourth portion 25d which opposes the first conductive layer 27 which is the drain electrode with the channel protection film 26 interposed is higher than that of the third portion 25c. In particular, the resistance of the portion 25da of the fourth portion 25d on the second channel protection film 262 side is higher than that of a portion 25db of the fourth portion 25d on the gate insulating film 24 side. Accordingly, the drive TFT 122 having the desired characteristics is obtained because the portion of the semiconductor layer 25 that functions as the active layer is not short.

The length in the X direction of the second portion 25b of the semiconductor layer 25 covered with the second channel protection film 262 is, for example, not more than 3 μm, and more favorably not more than 1 μm. In other words, the length of the fourth portion and the length of the fifth portion along the direction connecting the first portion and the second portion are, for example, not more than 3 μm, and more favorably not more than 1 μm. The resistance of the fourth portion 25d can be sufficiently high by the length of the second portion 25b in the X direction being such a length.

The resistivity of the portion 25da of the fourth portion 25d on the second channel protection film 262 side is, for example, not less than $1.0 \times 10^5$ Ω·cm, and more favorably not less than $1.0 \times 10^7$ Ω·cm. The portion 25da of the fourth portion 25d on the second channel protection film 262 side is, for example, the half of the portion of the semiconductor layer 25 provided between the second channel protection film 262 and the gate insulating film 24 that is more proximal to the second channel protection film 262 than to the gate insulating film 24 in the Z direction. For example, the resistivity at a position where the distance from the second channel protection film 262 in the Z direction is not more than one-third of the thickness of the semiconductor layer 25 may be not less than $1.0 \times 10^5$ Ω·cm, and more favorably not less than $1.0 \times 10^7$ Ω·cm.

On the other hand, the resistivity of the portion 25db of the fourth portion 25d on the gate insulating film 24 side may be, for example, not more than $1.0 \times 10^5$ Ω·cm, and more favorably not more than $1.0 \times 10^3$ Ω·cm. The portion 25db of the fourth portion 25d on the gate insulating film 24 side is, for example, the half of the portion of the semiconductor layer 25 provided between the second channel protection film 262 and the gate insulating film 24 that is more proximal to the gate insulating film 24 than to the second channel protection film 262 in the Z direction. For example, the resistivity at a position where the distance from the gate insulating film 24 in the Z direction is not more than one-third of the thickness of the semiconductor layer 25 is not more than $1.0 \times 10^5$ Ω·cm, and more favorably not more than $1.0 \times 10^3$ Ω·cm.

End portions 25X and 25Y of the semiconductor layer 25 where a line perpendicular to a line segment L parallel to the X direction connecting the first conductive layer 27 and the second conductive layer 28 intersects the end portions of the semiconductor layer 25 are covered with the first channel protection film. The oxygen inside the oxide semiconductor of the semiconductor layer 25 easily escapes due to the heat when forming the passivation film 29. There is a risk that a leak current may occur in the drive TFT in which the oxygen has escaped from the semiconductor layer 25. However, the oxygen can be prevented from escaping from the semiconductor layer 25 when forming the passivation film 29 by the upper surface and the end portions 25X and 25Y of the semiconductor layer 25 being covered with the channel protection film 26.

To prevent the leak current, it is sufficient for a portion of the end portions 25X and 25Y of the semiconductor layer 25 to be covered with the channel protection film 26; and it is also possible for the channel protection film 26 to have a configuration that covers a portion of the end portions 25X and 25Y of the semiconductor layer 25.

Although the semiconductor layer 25 in the embodiment has a configuration that is smaller than the gate electrode 23 in the XY plane, it is sufficient for at least a portion of the semiconductor layer 25 provided between the first conductive layer 27 and the second conductive layer 28 in the XY plane to oppose the gate electrode 23.

Figure 5:
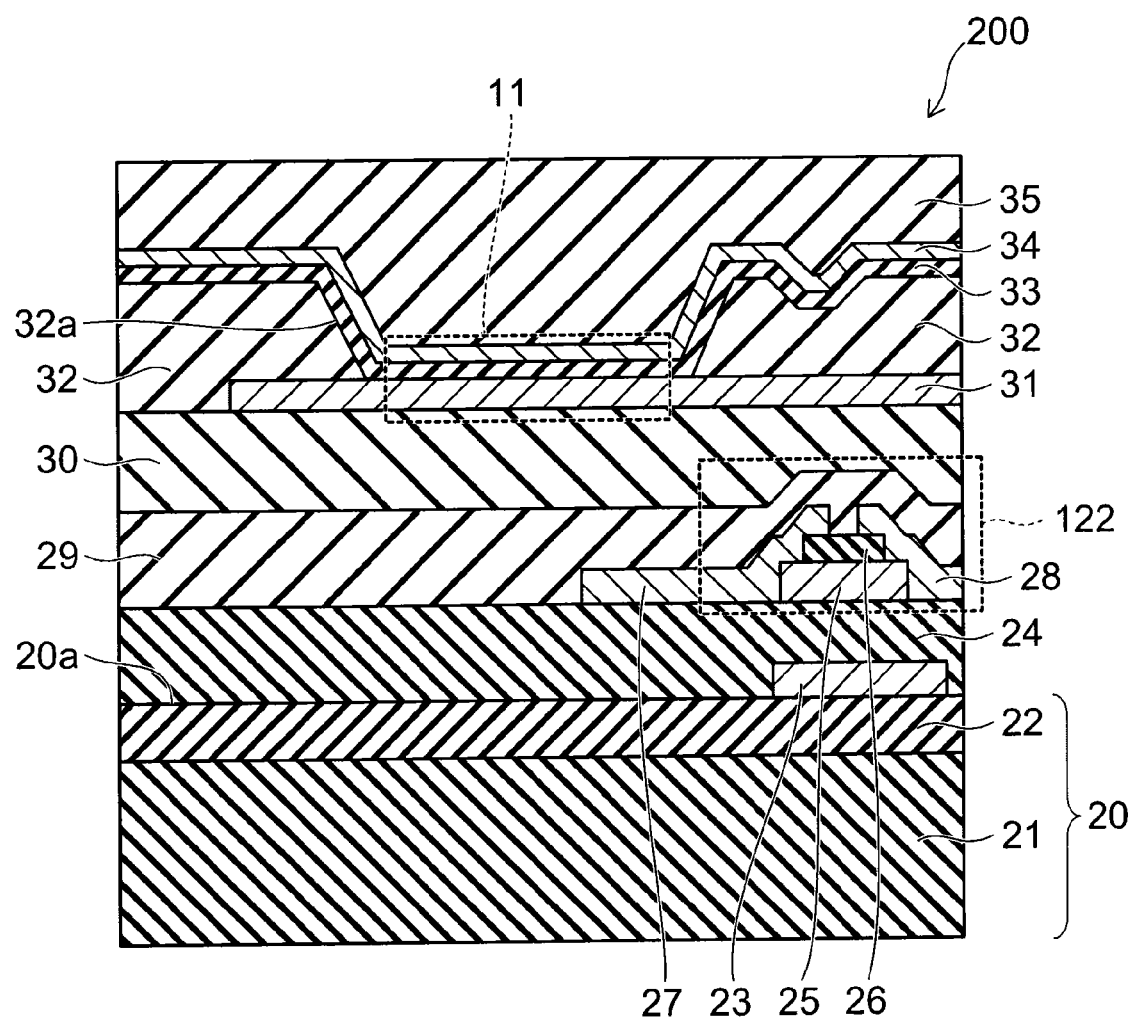
FIG. 5 is a partial cross-sectional view showing the display device according to the first embodiment.

A display device including the drive TFT 122 described using FIG. 2 to FIG. 4 will now be described using FIG. 5. FIG. 5 is a partial cross-sectional view showing the display device according to the first embodiment.

The display device 200 includes the substrate 20, the drive TFT 122, a pixel electrode 16, and the organic EL element 11. The organic EL element 11 is formed of an organic layer 33, a pixel electrode 31, and an opposing electrode 34. The organic EL element 11 is controlled and driven by the drive TFT 122.

The substrate 20 has the major surface 20a. The substrate 20 includes a main body 21, and a barrier layer 22 provided on the main body 21. The major surface 20a is a major surface of the substrate 20 on the barrier layer 22 side. The main body 21 may include, for example, a material that is light-transmissive. The main body 21 may include, for example, a glass material or a resin material. Also, the main body 21 may include a material that is flexible. The main body 21 may include, for example, a resin material such as a glass material, polyimide, etc. The barrier layer 22 suppresses the permeation of impurities, moisture, etc., to protect the drive TFT 122 and the organic EL element 11. The barrier layer 22 may include, for example, a material that is light-transmissive and flexible. The barrier layer 22 is omissible; and it is sufficient for the substrate 20 to be formed such that the permeation of impurities, moisture, etc., is suppressed at the major surface 20a of the side on which the gate electrode 23 is provided.

The drive TFT 122 described in FIG. 2 to FIG. 4 is provided on the major surface 20a of the substrate 20.

In the example, a color filter 30 is provided on the passivation film 29. The color filter 30 has a different color for each pixel. The color filter 30 may include, for example, a colored resin film (e.g., a color resist) that is red, green, or blue. The color filter 30 may be provided if necessary. The color filter 30 is omissible.

The pixel electrode 31 is provided on the color filter 30. The pixel electrode 31 is electrically connected to one selected from the first conductive layer 27 and the second conductive layer 28. Although not-shown in FIG. 5, the pixel electrode 31 is electrically connected to the second conductive layer 28 (e.g., the drain electrode) in the embodiment. In the embodiment, the pixel electrode 31 is the anode electrode. The pixel electrode 31 may include, for example, a material that is conductive and light-transmissive. The pixel electrode 31 may include, for example, ITO (Indium Tin Oxide), a stacked structure of ITO/Ag/ITO, AZO which is ZnO doped with Al, etc.

An opening is provided in the passivation film 29 and in the color filter 30 to expose a portion of the second conductive layer 28. A portion 16c of the pixel electrode 31 contacts the second conductive layer 28 via the opening. Thereby, the pixel electrode 31 is electrically connected to the second conductive layer 28.

A planarization film 32 is provided on the pixel electrode 31 and the color filter 30. The planarization film 32 may include, for example, a material that is insulative. The planarization film 32 includes, for example, an organic resin material. An opening 32a is provided in the planarization film 32 to expose a portion of the pixel electrode 31.

The organic layer 33 is provided on the planarization film 32 and the opening 32a. The organic layer 33 contacts the pixel electrode 31 at the opening 32a. The planarization film 32 prevents the pixel electrode 31 and the organic layer 33 from contacting each other in regions other than the opening 32a. The organic layer 33 includes, for example, a stacked body in which a hole transport layer, a light emitting layer, and an electron transport layer are stacked. Or, a hole injection layer may be used instead of the hole transport layer. Also, an electron injection layer may be used instead of the electron transport layer. Or, the organic layer 33 may include a hole injection layer in addition to the hole transport layer. The organic layer 33 may include an electron injection layer in addition to the electron transport layer.

The opposing electrode 34 is provided on the organic layer 33. The opposing electrode 34 includes a material that is conductive. In the embodiment, the opposing electrode 34 is the cathode electrode. The opposing electrode 34 includes, for example, aluminum (Al) and/or magnesium-silver (MgAg). The film thickness of the opposing electrode 34 is, for example, 200 nm.

For example, the organic EL element 11 is formed of the pixel electrode 31, the opposing electrode 34, and the organic layer 33 provided between the pixel electrode 31 and the opposing electrode 34 at the portion where the opening 32a is provided. Light is emitted from the organic layer 33 by a voltage being applied to the pixel electrode 31 and the opposing electrode 34. The light emitted from the organic layer 33 is emitted to the outside by passing through the color filter 30, the passivation film 29, the gate insulating film 24, and the substrate 20. In other words, in the embodiment, the display device 200 is a bottom-emitting display device.

A sealing unit 35 is provided on the opposing electrode 34. The sealing unit 35 includes, for example, a silicon oxide film, a silicon oxynitride film, a silicon nitride film, an alumina and tantalum oxide film, etc.

Although the write TFT 121 is not shown in FIG. 2 to FIG. 5, the write TFT 121 may be formed of the same material and in the same configuration as the drive TFT 122.

Although the pixel electrode 31 is the anode electrode and the opposing electrode 34 is the cathode electrode in the embodiment, the pixel electrode 31 may be the cathode electrode; and the opposing electrode 34 may be the anode electrode. Although each of the pixel units 1 has two TFTs, i.e., the write TFT 121 and the drive TFT 122, it is sufficient for each of the pixel units 1 to have at least one TFT such as that shown in FIG. 2 to FIG. 4.

Figure 6:
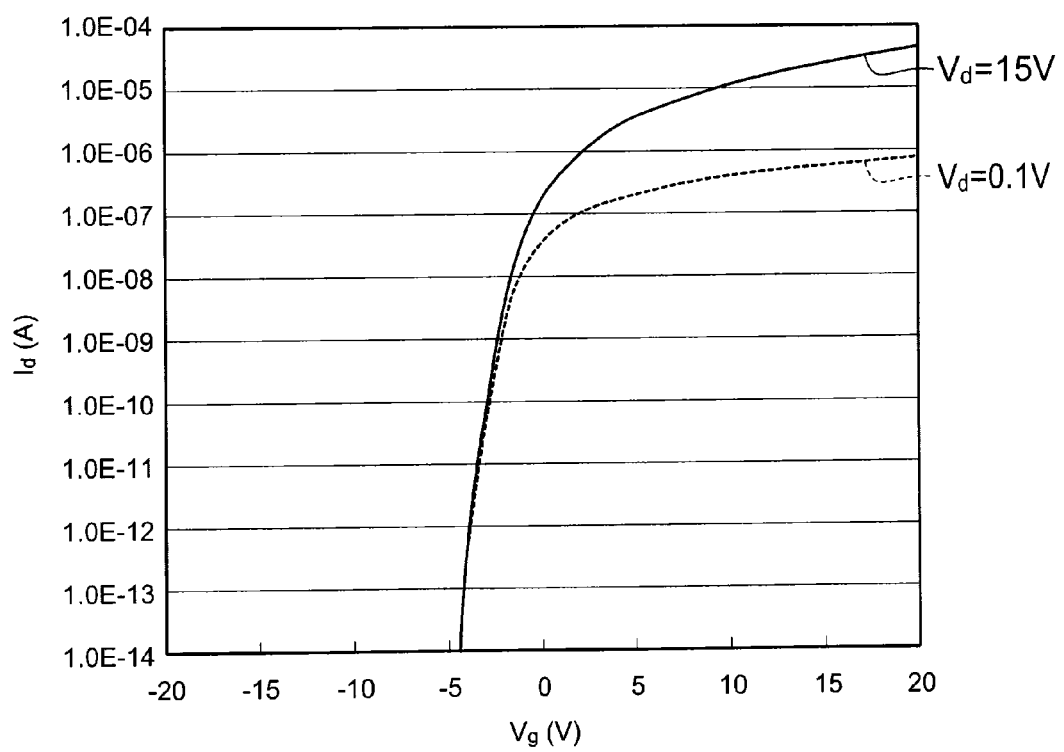
FIG. 6 is a graph showing characteristics of the thin film transistor according to the first embodiment.

Characteristics obtained by measuring the drive TFT 122 shown in FIG. 2 to FIG. 4 will now be described using FIG. 6. FIG. 6 is a graph showing characteristics of the thin film transistor according to the first embodiment. The horizontal axis represents a voltage $V_g$ (with units of V) applied to the gate electrode; and the vertical axis represents a current $I_d$ (with units of A) flowing through the region (the drain region) of the semiconductor layer 25 that opposes the drain electrode (the first conductive unit 27). FIG. 6 shows the relationship between the voltage $V_g$ and the current $I_d$ when a voltage $V_d$ applied to the drain electrode (the first conductive unit 27) is 0.1 V and 15 V. The threshold voltage at which the current $I_d$ starts to flow is the same for the voltage $V_d$ of 0.1 V and 15 V; and the characteristic of the drive TFT 122 is stable when the voltage $V_d$ of the drain electrode is changed. Thus, the drive TFT of the embodiment has a stable threshold voltage regardless of the voltage $V_d$ of the drain electrode.

Figure 7:
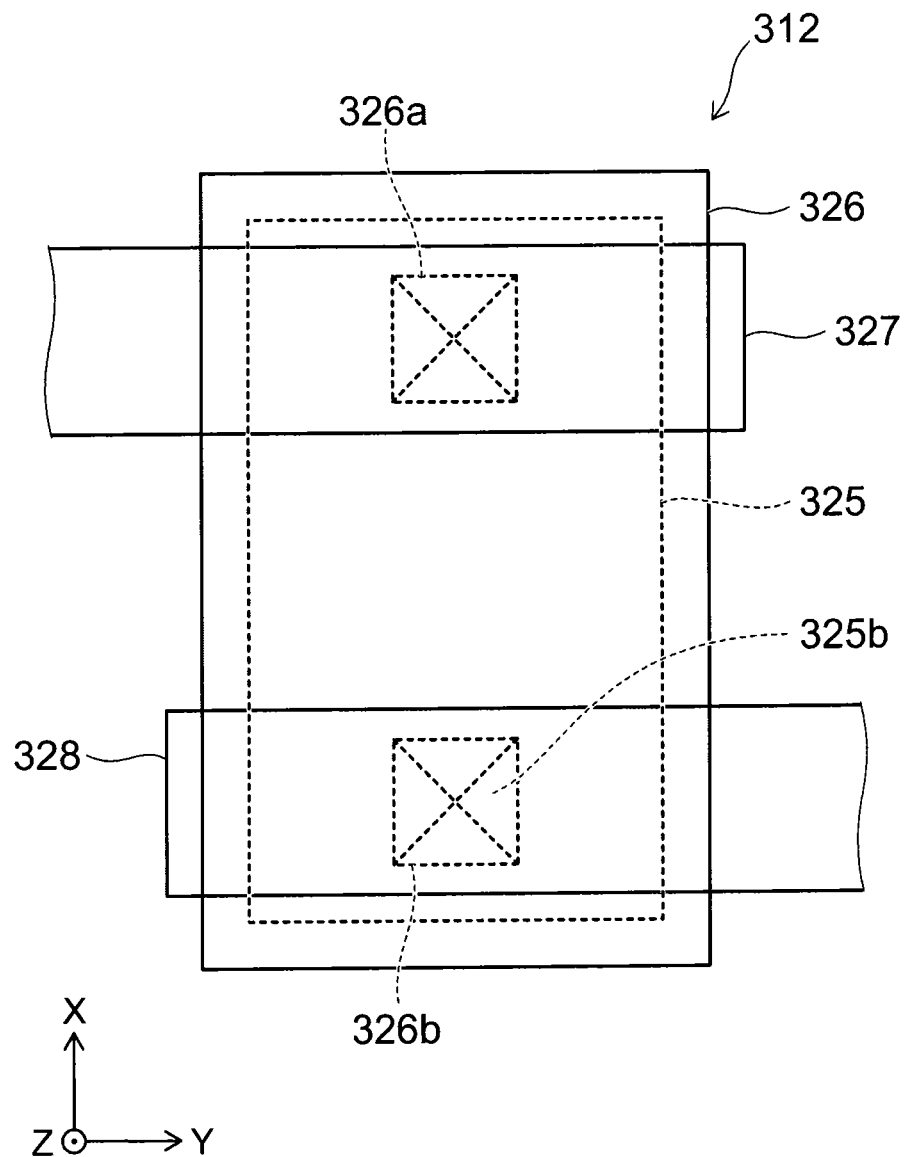
FIG. 7 is a plan view showing a thin film transistor according to a comparative example.
Figure 8:
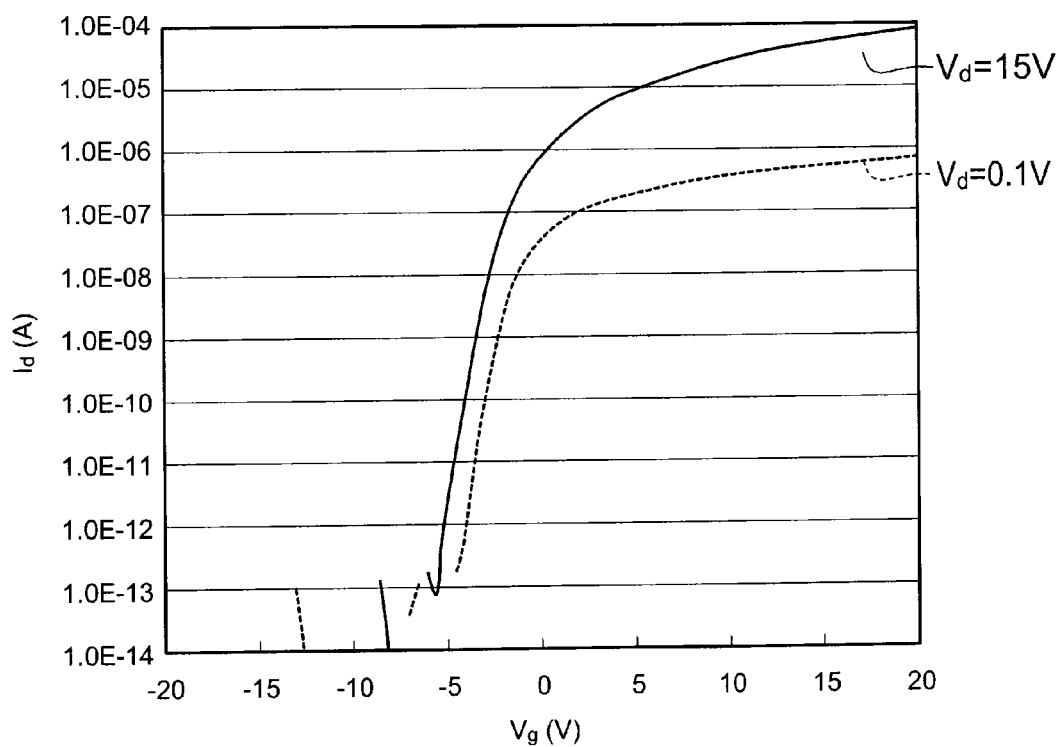
FIG. 8 is a graph showing characteristics of the thin film transistor according to the comparative example.

A comparative example of the embodiment will now be described using FIG. 7 and FIG. 8. FIG. 7 is a plan view showing a thin film transistor according to the comparative example. FIG. 8 is a graph showing characteristics obtained by measuring the thin film transistor according to the comparative example.

In the TFT 312 according to the comparative example, one type of film is formed as a channel protection film 326. The entire opening 326a of the channel protection film 326 is covered with a first conductive layer 327; and the entire opening 326b is covered with a second conductive layer 328. Accordingly, a semiconductor layer 325 does not contact a passivation film 329. A gate electrode 323 and a gate insulating film 324 are similar to those of the first embodiment.

In FIG. 8, the horizontal axis represents the voltage $V_g$ (with units of V) applied to the gate electrode; and the vertical axis represents the current $I_d$ (with units of A) flowing through the region (the drain region) of the semiconductor layer 25 that opposes the drain electrode (the first conductive layer 27). FIG. 8 shows the relationship between the voltage $V_g$ and the current $I_d$ when the voltage $V_d$ applied to the drain electrode (the first conductive layer 27) is 0.1 V and 15 V. The threshold voltage is higher when the voltage $V_d$ is 0.1 V than when the voltage $V_d$ is 15 V; and the characteristic of the TFT 312 is unstable when the voltage $V_d$ of the drain electrode is changed. Thus, for the TFT 312 according to the comparative example, the threshold voltage becomes unstable according to the voltage $V_d$ of the drain electrode.

It is known that many defects occur easily in the semiconductor layer of the TFT in the case where the semiconductor layer includes an oxide semiconductor; and controlling the defects leads to higher reliability of the TFT.

The inventors obtained the following knowledge as a result of diligent development of TFTs that use oxide semiconductors. Namely, at the interface covered with the channel protection film 326 of the semiconductor layer 325 in a conventional TFT such as that shown in FIG. 7, when the bonds between the atoms of the oxide semiconductor are weak, the resistance of a second portion 325b of the semiconductor layer 325 opposing the drain electrode (the first conductive layer 327) with the channel protection film 326 interposed undesirably decreases due to the electric field of the drain electrode (the first conductive layer 327). In the case where the resistance of the second portion 325b of the semiconductor layer 325 decreases, the channel length which is the length of the portion of the semiconductor layer 25 that functions as the active layer is undesirably shorter than the design value. As a result, as shown in the comparative example, the threshold voltage undesirably changes due to the voltage $V_d$ of the drain electrode; and the desired TFT characteristics are not obtained. However, in the TFT 122 of the first embodiment, the fourth portion 25d of the semiconductor layer opposing the drain electrode 327 has a high resistance. Accordingly, the fourth portion 25d does not easily have a low resistance and functions as an active layer. In other words, the threshold voltage of the TFT can be stabilized regardless of the electric field strength of the drain electrode.

First Variation of the First Embodiment

Figure 9:
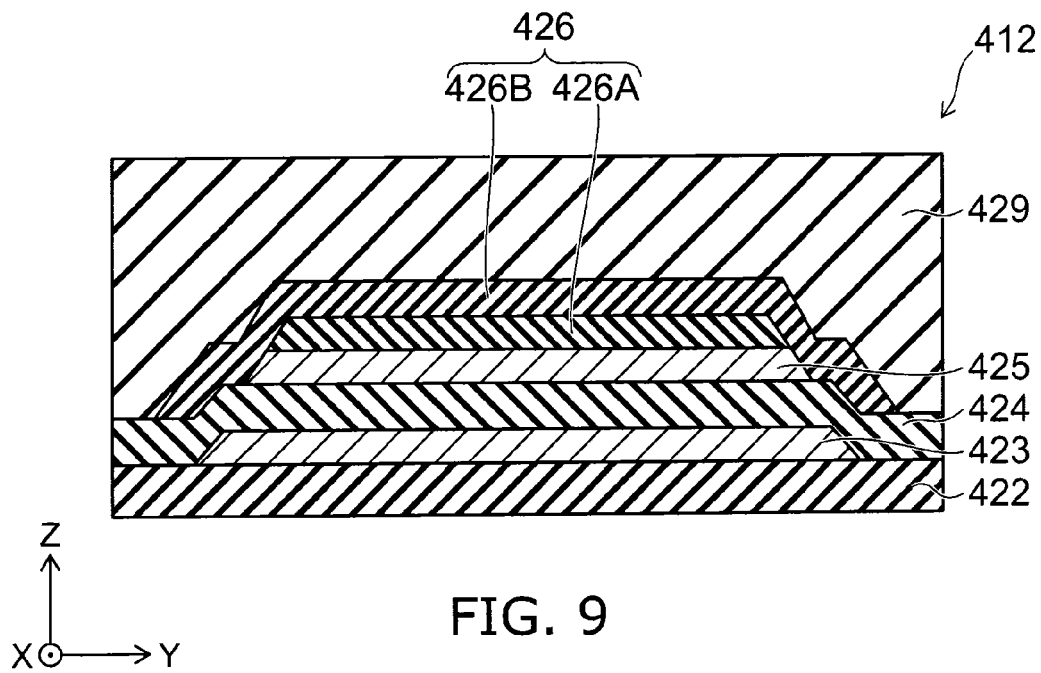
FIG. 9 is a cross-sectional view showing a thin film transistor according to a first variation of the first embodiment.

FIG. 9 is a cross-sectional view showing a thin film transistor according to a first variation of the first embodiment.

The drive TFT 412 of the variation differs from the drive TFT 122 of the first embodiment in that the configuration of a channel protection film 426 in the YZ plane is different. The channel protection film 426 is made of a first channel protection film 426A and a second channel protection film 426B. The first channel protection film 426A is provided on the upper surface of a semiconductor layer 425. The second channel protection film 426B covers the upper surface of the first channel protection film 426A, the side surface of the first channel protection film 426A, and the side surface of the semiconductor layer 425. In other words, the drive TFT 412 of the variation differs from the drive TFT 122 of the first embodiment in that the second channel protection film 426B covers the first channel protection film 426A and the side surface of the semiconductor layer 425 in the YZ plane. Restated, the end portion of the semiconductor layer 425 where a line perpendicular to a line segment parallel to the Y direction connecting the first conductive layer and the second conductive layer intersects the end portion of the semiconductor layer 425 is covered with the second channel protection film 426B. According to the variation as well, oxygen can be prevented from escaping from the semiconductor layer 425 when forming a passivation film 429.

The cross-sectional view of the XZ plane of a gate electrode 423, a gate insulating film 424, the passivation film 429, and the drive TFT 412 is the same as that of the first embodiment. In other words, similarly to the first embodiment, the degree of oxidation of the second channel protection film 426B is higher than that of the first channel protection film 426A; and the passivation film 429 and the semiconductor layer 425 contact each other via the opening of the channel protection film 426.

In the variation, similarly to the first embodiment, a portion of the semiconductor layer 425 opposes the drain electrode with the second channel protection film 426B, which has a high degree of oxidation, being interposed. Accordingly, the side of this portion proximal to the second channel protection film 426B has a high resistance. Because the semiconductor layer 425 and the passivation film 429 contact each other via the opening, the hydrogen included in the passivation film 429 easily diffuses into the semiconductor layer 425. Thus, the portion of the semiconductor layer 425 opposing the drain electrode with the channel protection film 426 interposed has a high resistance. In particular, the channel protection film 426 side of this portion has a high resistance. Accordingly, the drive TFT 412 having the desired characteristics is obtained because the portion of the semiconductor layer 425 that functions as the active layer is not short.

Second Variation of First Embodiment

Figure 10:
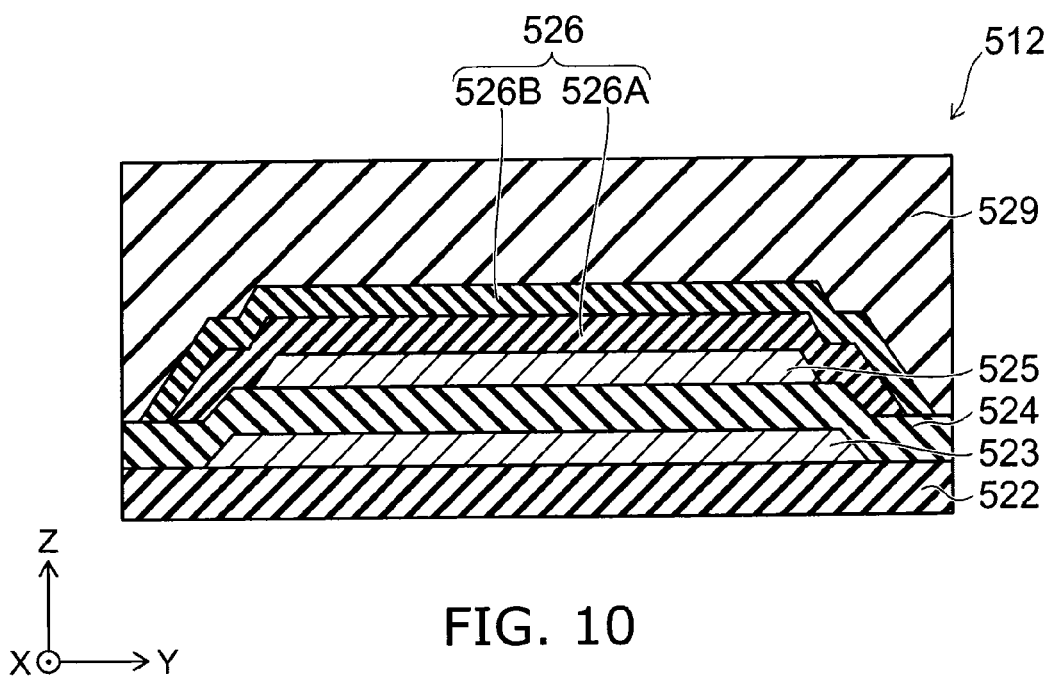
FIG. 10 is a cross-sectional view showing a thin film transistor according to a second variation of the first embodiment.

FIG. 10 is a cross-sectional view showing a thin film transistor according to a second variation of the first embodiment.

The drive TFT 512 of the variation differs from the drive TFT 122 of the first embodiment in that the configuration of a channel protection film 526 in the YZ plane is different. The channel protection film 526 is made of a first channel protection film 526A and a second channel protection film 526B. The first channel protection film 526A covers the upper surface and side surface of a semiconductor layer 525. Unlike the drive TFT 122 of the first embodiment, the second channel protection film 526B covers the upper surface and side surface of the first channel protection film 526A. Restated, the end portion of the semiconductor layer 525 where a line perpendicular to a line segment parallel to the Y direction connecting the first conductive layer and the second conductive layer intersects the end portion of the semiconductor layer 525 is covered with the first channel protection film 426A and the second channel protection film 526B. According to the variation as well, oxygen can be prevented from escaping from the semiconductor layer 525 when forming a passivation film 529.

The cross-sectional view in the XZ plane of a gate electrode 523, a gate insulating film 524, the passivation film 529, and the drive TFT 512 is the same as that of the first embodiment. In other words, similarly to the first embodiment, the degree of oxidation of the second channel protection film 526B is higher than that of the first channel protection film 526A; and the passivation film 529 and the semiconductor layer 525 contact each other via the opening of the channel protection film 526.

In the variation, similarly to the first embodiment, a portion of the semiconductor layer 525 opposes the drain electrode with the second channel protection film 526B, which has a high degree of oxidation, being interposed. Accordingly, the side of this portion proximal to the second channel protection film 526B has a high resistance. Because the semiconductor layer 525 and the passivation film 429 contact each other via the opening, the hydrogen included in the passivation film 529 easily diffuses into the semiconductor layer 525. Thus, the portion of the semiconductor layer 525 opposing the drain electrode with the channel protection film 526 interposed has a high resistance. In particular, the channel protection film 526 side of this portion has a high resistance. Accordingly, the drive TFT 512 having the desired characteristics is obtained because the portion of the semiconductor layer 525 that functions as the active layer is not short.

Second Embodiment

Figure 11:
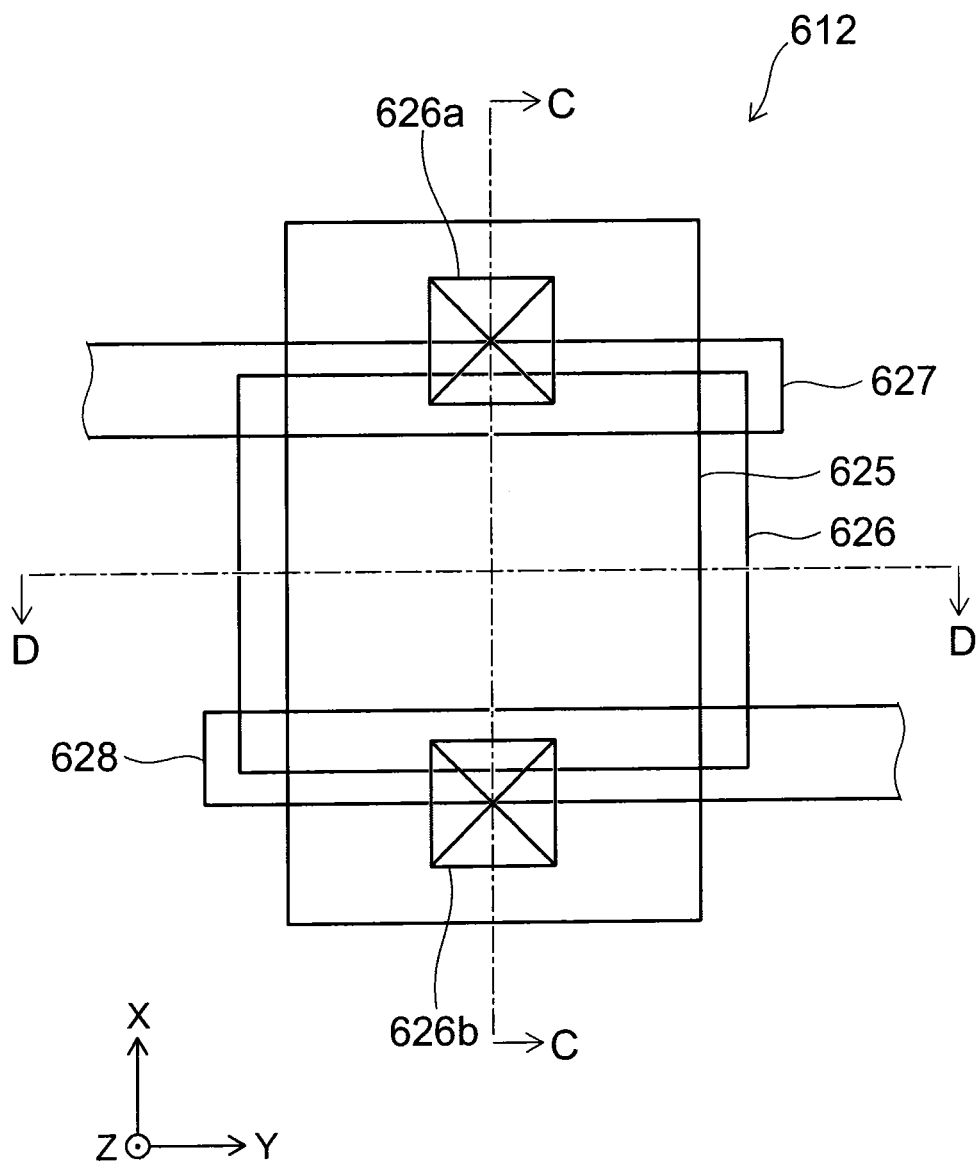
FIG. 11 is a plan view showing a thin film transistor according to a second embodiment.
Figure 12:
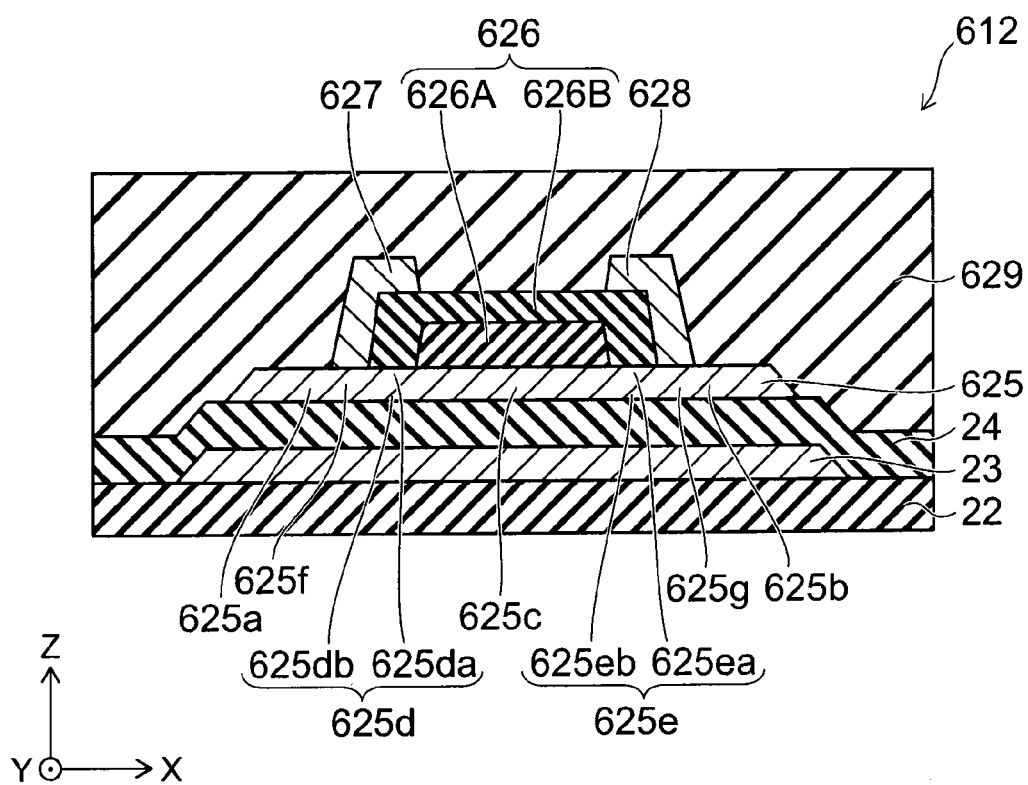
FIG. 12 is a cross-sectional view showing the thin film transistor according to the second embodiment.

FIG. 11 is a plan view showing a thin film transistor according to a second embodiment. FIG. 12 is a cross-sectional view showing the thin film transistor according to the second embodiment. FIG. 12 is a cross-sectional view along line C-C of FIG. 11. The line D-D cross-sectional view of FIG. 11 is the same as FIG. 4 of the first embodiment.

In the drive TFT 122 of the embodiment, the configuration of a channel protection film 626 is different from that of the first embodiment. In other words, the channel protection film 626 is provided on only a portion of the upper surface of a semiconductor layer 625. A first channel protection film 626A is provided on a portion of the upper surface of the semiconductor layer 625; and a second channel protection film 626B covers the upper surface of the first channel protection film 626A and the side surface of the first channel protection film 626A along the X direction. The second channel protection film 626B is a film having a higher degree of oxidation than the first channel protection film 626A.

A first conductive layer 627 and a second conductive layer 628 oppose each other in the X direction. A portion of the first conductive layer 627 is electrically connected to the semiconductor layer 625. One other portion of the first conductive layer 627 covers a portion of the second channel protection film 626B. A portion of the second conductive layer 628 is electrically connected to the semiconductor layer 625. One other portion of the second conductive layer 628 covers a portion of the second channel protection film 626B.

The first conductive layer 627, the second conductive layer 628, the channel protection film 626, and the semiconductor layer 625 are covered with a passivation film 629. The semiconductor layer 625 contacts the passivation film 629 outside the first conductive layer 627 and the second conductive layer 628 in the X direction. The passivation film 629 includes hydrogen. The passivation film 629 contains, for example, not less than $1.0 \times 10^{20}$ atoms/cm$^3$ of hydrogen.

A gate electrode 623, a gate insulating film 624, and the semiconductor layer 625 are similar to those of the first embodiment.

The semiconductor layer 625 includes a first portion 625a, a second portion 625b opposing the first portion 625a in the X direction, a third portion 625c provided between the first portion 625a and the second portion 625b, a fourth portion 625d provided between the first portion 625a and the third portion 625c, a fifth portion 625e provided between the second portion 625b and the third portion 625c, a sixth portion 625f provided between the first portion 625a and the fourth portion 625d, and a seventh portion 625g provided between the second portion 625b and the fifth portion 625e.

The first channel protection film 626A covers the third portion 625c of the semiconductor layer 625. The second channel protection film 626B covers the upper surface of the first channel protection film 626A, the fourth portion 625d of the semiconductor layer 625, and the fifth portion 625e of the semiconductor layer 625. The first conductive layer 627 covers the sixth portion 625f while opposing the fourth portion 625d of the semiconductor layer 625 with the second channel protection film 626B interposed. The second conductive layer 628 covers the seventh portion 625g while opposing the fifth portion 625e of the semiconductor layer 625 with the second channel protection film 626B interposed. The passivation film 629 covers the second channel protection film 626B, the second conductive layer 628, the first conductive layer 627, the second portion 625b of the semiconductor layer 625, and the first portion 625a of the semiconductor layer 625. The passivation film 629 contains, for example, not less than $1.0 \times 10^{20}$ atoms/cm$^3$ of hydrogen.

The length in the X direction of the second portion 25b covered with the second channel protection film 262 of the semiconductor layer 25 is, for example, not more than 3 μm, and more favorably not more than 1 μm. By the length of the second portion 25b in the X direction being such a length, the resistance of the fourth portion 25d can be sufficiently high.

The resistivity of a portion 625da of the fourth portion 625d on the second channel protection film 626B side may be, for example, not less than $1.0 \times 10^5$ Ω·cm, and more favorably not less than $1.0 \times 10^7$ Ω·cm. On the other hand, the resistivity of a portion 625db of the fourth portion 625d on the gate insulating film 24 side may be, for example, not more than $1.0 \times 10^5$ Ω·cm, and more favorably not more than $1.0 \times 10^3$ Ω·cm.

The length in the X direction of the second portion 625b covered with the second channel protection film 626B of the semiconductor layer 625 is, for example, not more than 3 μm, and more favorably not more than 1 μm. By the length of the second portion 625b in the X direction being such a length, the resistance of the fourth portion 625d can be sufficiently high.

In the embodiment as well, the resistance of the fourth portion 625d of the semiconductor layer 625 opposing the first conductive layer 627, which is the drain electrode, with the channel protection film 626 interposed is higher than that of the third portion 625c of the semiconductor layer 625. In particular, the resistance of the portion 625da of the fourth portion 625d on the second channel protection film 626B side is higher than that of the portion 625db of the fourth portion 625d on the gate insulating film 24 side. Accordingly, a drive TFT 612 having the desired characteristics is obtained because the portion of the semiconductor layer 625 that functions as the active layer is not short.

Third Embodiment

In the embodiment, an example of a method for manufacturing a thin film transistor and a display device according to the first embodiment will be described. FIG. 13A to FIG. 13F are cross-sectional views showing the method for manufacturing the thin film transistor according to the third embodiment. FIG. 14A to FIG. 14D are cross-sectional views showing the manufacturing method continuing from FIG. 13F of the thin film transistor according to the third embodiment.

Figure 13A:
FIG. 13A to FIG. 13F are cross-sectional views showing a method for manufacturing a thin film transistor according to a third embodiment.
Figure 13B:
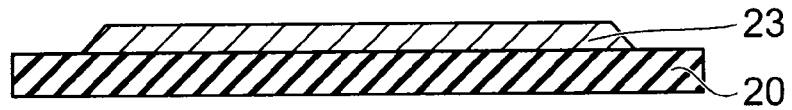

First, the substrate 20 that includes the main body 21 and the barrier layer 22 provided on the main body 21 is prepared (FIG. 13A). Then, the gate electrode 23 is formed on a portion of the major surface 20a of the substrate 20 where the barrier layer 22 is provided (FIG. 13B). It is favorable for the taper which is the angle between the side surface of the gate electrode 23 and the major surface 20a of the substrate 20 to be about 10° to 40°, and more favorably about 30°. By forming the taper within this range, the occurrence of the leak current can be suppressed. The taper angle is the angle between the plane parallel to the one major surface 24a and the side surface of the gate electrode 23 that is non-parallel to the one major surface 24a of the gate insulating film 24.

Figure 13C:
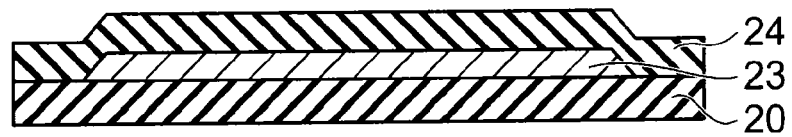
Figure 13D:
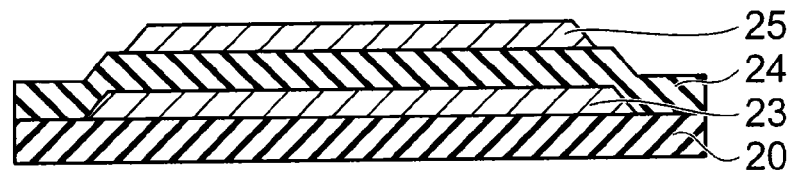

Then, the gate insulation film 24 is formed to cover the gate electrode 23 and the substrate 20 (FIG. 13C). Continuing, the semiconductor layer 25 is formed to oppose the gate electrode 23 with the gate insulating film 24 interposed (FIG. 13D). It is favorable for the semiconductor layer 25 to be inside the gate electrode 23 when projected onto the XY plane. Also, it is favorable for the side surface of the semiconductor layer 25 to have a taper. In other words, it is favorable to be tilted with respect to the major surface 20a of the substrate 20. Thereby, a bump in the electrical characteristics occurring at the side surface of the semiconductor layer 25 due to electric field concentration can be suppressed.

Figure 13E:
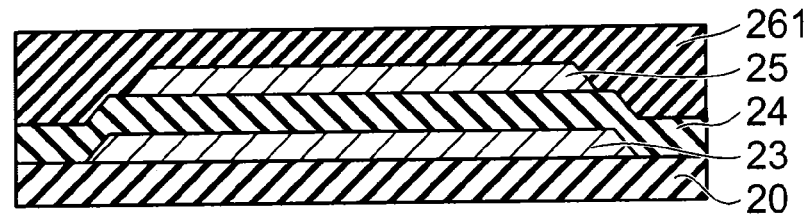
Figure 13F:
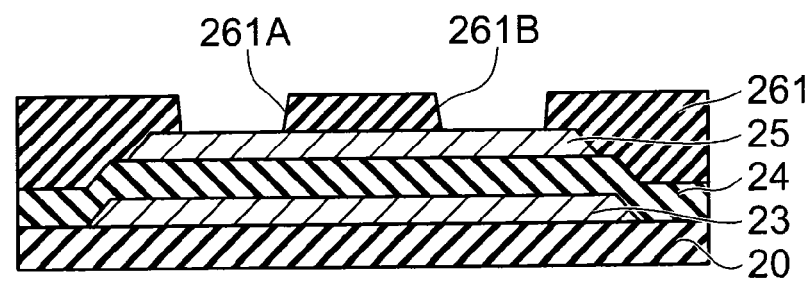
Figure 14A:
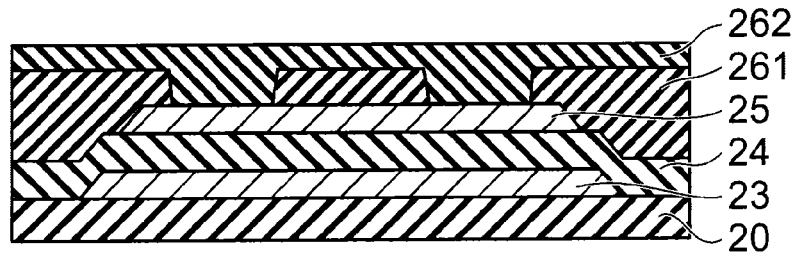
FIG. 14A to FIG. 14D are cross-sectional views showing the method for manufacturing the thin film transistor according to the third embodiment.

The channel protection film 26 is formed on the upper surface of the semiconductor layer 25 and on the gate insulating film 24. Specifically, the first channel protection film 261 is formed to cover the semiconductor layer 25 and the gate insulating film 24 (FIG. 13E). Then, two openings 261A and 261B are made in the first channel protection layer 261 (FIG. 13F). Continuing, the second channel protection film 262 is formed to cover the first channel protection film 261 at conditions that are more peroxidic than those of the first channel protection film 261 (FIG. 14A).

As described above, in the TFT 122 in which the InGaZnO film is used as the semiconductor layer, the characteristics fluctuate greatly according to the film formation conditions of the first channel protection film 261 that is formed on the InGaZnO film. For example, in the case where the first channel protection film 261 and the second channel protection film 262 are $SiO_2$ formed by PE-CVD using a $SiH_4 \cdot N_2O$ gas, the second channel protection film 262 can be a film having a higher degree of oxidation than the first channel protection film 261 the second channel protection film 262 by reducing the flow rate ratio of the source-material gas including Si, reducing the film formation rate, or reducing the film formation temperature. A high degree of oxidation means that the element ratio O/Si of oxygen and silicon is high.

Figure 14B:
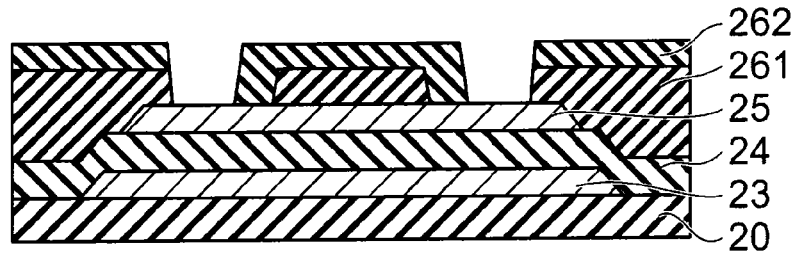

Subsequently, the first opening 26a and the second opening 26b are made at positions corresponding to the two openings 261A and 261B of the first channel protection film 261 (FIG. 14B). It is favorable to perform annealing after forming the channel protection film 26. The defects of the interface of the semiconductor layer 25 and the channel protection film 26 can be reduced by the annealing. The annealing may be performed prior to or after providing the first opening 26a and the second opening 26b. It is favorable for the annealing temperature to be 200° C. to 400° C., and more favorably 250° C. to 350° C. It is favorable for the annealing atmosphere to be an inert gas atmosphere.

Figure 14C:
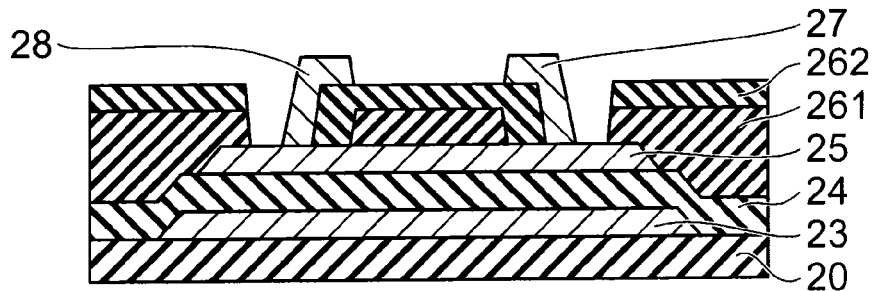

Then, the first conductive layer 27 is formed to cover a portion of the first opening 26a and a portion of the second channel protection film 262. The second conductive layer 28 is formed to cover a portion of the second opening 26b and a portion of the second channel protection film 262 (FIG. 14C).

Figure 14D:
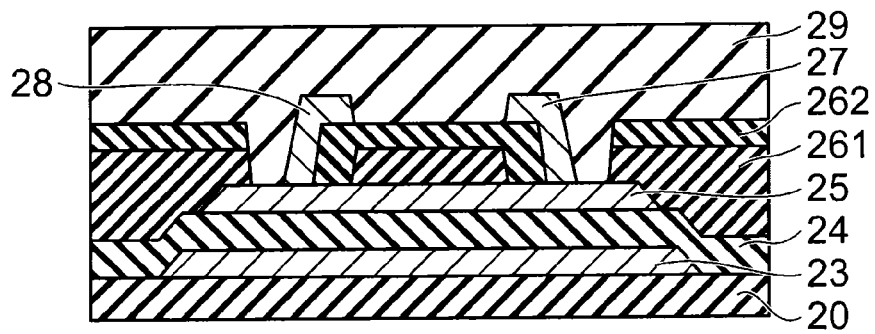

Continuing, the passivation film 29 is formed to cover the semiconductor layer 25 that is exposed from the first conductive layer 27, the second conductive layer 28, the second channel protection film 262, the first opening 26a, and the second opening 26b (FIG. 14D).

Thus, the drive TFT 122 can be formed.

Figure 15:
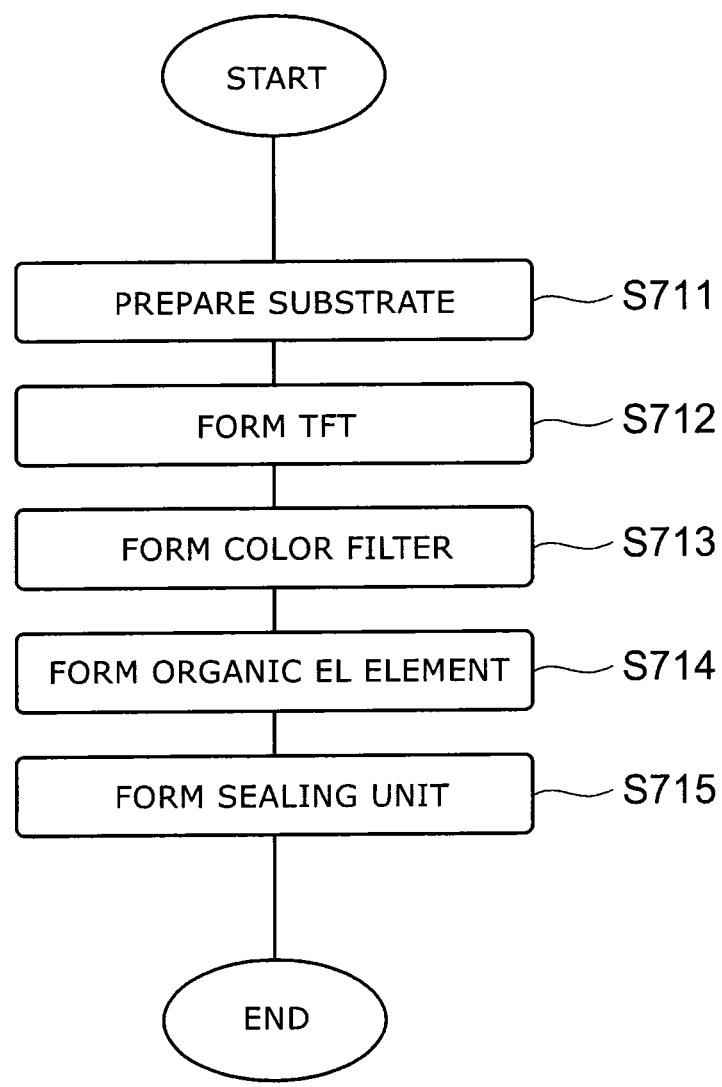
FIG. 15 is a flowchart showing the method for manufacturing the display device according to the third embodiment.

FIG. 15 is a flowchart showing the method for manufacturing the display device according to the third embodiment. In the manufacturing of the display device, first, the substrate 20 is prepared (S711). Then, as described above, the TFT is formed on the substrate 20 (S712). Continuing, the color filter is formed (S713). This process is omissible. Then, the organic EL element 11 is formed (S714). Continuing, the sealing unit 35 is formed (S715). Thus, the display device is formed.

In the drive TFT 122 obtained in the embodiment, the resistance of the fourth portion 25d of the semiconductor layer 25 that opposes the first conductive layer 27, which is the drain electrode, with the channel protection film 26 interposed is higher than that of the third portion 25c. In particular, the resistance of the portion 25da of the fourth portion 25d on a second channel protection film 26B side is higher than that of the portion 25db of the fourth portion 25d on the gate insulating film 24 side. Accordingly, the drive TFT 122 and the display device having the desired characteristics are obtained because the portion of the semiconductor layer 25 that functions as the active layer is not short.

Hereinabove, exemplary embodiments of the invention are described with reference to specific examples. However, the embodiments of the invention are not limited to these specific examples. The specific configurations of the components can be suitably selected from publicly known arts by those skilled in the art, and such configurations are encompassed within the scope of the invention as long as they can also implement the invention and achieve similar effects.

Further, any two or more components of the specific examples may be combined within the extent of technical feasibility and are included in the scope of the invention to the extent that the purport of the invention is included.

Moreover, all thin film transistors and display devices practicable by an appropriate design modification by one skilled in the art based on the thin film transistors and display devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A display device comprising a thin film transistor, the thin film transistor comprising:
   a gate insulating film having a major surface;
   a semiconductor layer on a portion of the major surface, the semiconductor layer comprising
   a first portion,
   a second portion separated from the first portion in a plane parallel to the major surface, a third portion between the first portion and the second portion, a fourth portion between the first portion and the third portion, a fifth portion between the second portion and the third portion, a sixth portion between the first portion and the fourth portion, and a seventh portion between the second portion and the fifth portion;

a gate electrode, the gate insulating film being disposed between the semiconductor layer and the gate electrode;

a first channel protection film covering the third portion of the semiconductor layer;

a second channel protection film covering the fifth portion, the fourth portion, and an upper surface of the first channel protection film;

a first conductive layer covering the sixth portion, a portion of the second channel protection film being disposed between the first conductive layer and the fourth portion;

a second conductive layer covering the seventh portion, a portion of the second channel protection film being disposed between the second conductive layer and the fifth portion; and a passivation film covering the first portion, the second portion, the first conductive layer, the second conductive layer, and the second channel protection film, the passivation film physically contacting the first portion and the second portion, and the passivation film including not less than $1.0 \times 10^{20}$ atoms/cm$^3$ of hydrogen, wherein the fourth portion includes a portion on a side of the second channel protection film, and a resistivity of the portion of the fourth portion on the side of the channel protection film is not less than $1.0 \times 10^5$ Ω·cm.

2. The device according to claim 1, wherein a length of the fourth portion along a direction connecting the first portion and the second portion is not more than 3 μm, and a length of the fifth portion along the connecting direction is not more than 3 μm.

3. The device according to claim 1, wherein the fourth portion includes a portion on a side of the gate insulating film, and a resistivity of the portion of the fourth portion on the side of the gate insulating film is not more than $1.0 \times 10^5$ Ω·cm.

4. The device according to claim 1, wherein the semiconductor layer comprises an end portion, a line perpendicular to a line segment connecting the first conductive layer and the second conductive layer intersects the end portion, and at least a portion of the end portion is covered with the first channel protection film.

5. The device according to claim 1, wherein the semiconductor layer comprises an end portion, a line perpendicular to a line segment connecting the first conductive layer and the second conductive layer intersects the end portion, and at least a portion of the end portion is covered with the second channel protection film.

6. The device according to claim 1, wherein an oxygen concentration of the second channel protection film is higher than an oxygen concentration of the first channel protection film.

7. The device according to claim 1, wherein a ratio of a number of oxygen atoms to a number of silicon atoms of the second channel protection film is higher than a ratio of a number of oxygen atoms to a number of silicon atoms of the first channel protection film.

8. The device according to claim 1, wherein the gate insulating film comprises at least one selected from the group consisting of silicon oxide, silicon nitride, silicon oxynitride, and aluminum oxide.

9. The device according to claim 1, wherein the semiconductor layer comprises an oxide comprising at least one selected from the group consisting of indium, gallium, and zinc.

10. The device according to claim 1, wherein the semiconductor layer comprises a portion in an amorphous state.

11. The device according to claim 1, wherein at least one selected from the first channel protection film and the second channel protection film comprises at least one selected from the group consisting of silicon oxide, silicon nitride, silicon oxynitride, and aluminum oxide.

12. The device according to claim 1, wherein the passivation film comprises one selected from the group consisting of silicon oxide, silicon nitride, and silicon oxynitride.

13. The device according to claim 1, wherein an angle between the plane and a side surface of the gate electrode non-parallel to the plane is not less than 10 degrees and not more than 40 degrees.

14. A thin film transistor, comprising:

a gate insulating film having one major surface;

a semiconductor layer on a portion of the major surface, the semiconductor layer comprising a first portion, a second portion separated from the first portion in a plane parallel to the major surface, a third portion between the first portion and the second portion, a fourth portion between the first portion and the third portion, a fifth portion between the second portion and the third portion, a sixth portion between the first portion and the fourth portion, and a seventh portion between the second portion and the fifth portion;

a gate electrode, the gate insulating film being disposed between the semiconductor layer and the gate electrode;

a first channel protection film covering the third portion of the semiconductor layer;

a second channel protection film covering the fifth portion, the fourth portion, and an upper surface of the first channel protection film;

a first conductive layer covering the sixth portion, a portion of the second channel protection film being disposed between the first conductive layer and the fourth portion;

a second conductive layer covering the seventh portion, a portion of the second channel protection film being disposed between the second conductive layer and the fifth portion; and a passivation film covering the first portion, the second portion, the first conductive layer, the second conductive layer, and the second channel protection film, the passivation film physically contacting the first portion and the second portion, and the passivation film comprising not less than $1.0 \times 10^{20}$ atoms/cm$^3$ of hydrogen, wherein the fourth portion includes a portion on a side of the second channel protection film, and a resistivity of the portion of the fourth portion on the side of the channel protection film is not less than $1.0 \times 10^5$ Ω·cm.

15. The transistor according to claim 14, wherein a length of the fourth portion along a direction connecting the first portion and the second portion of the semiconductor layer is not less than 1 μm, and a length of the fifth portion along the connecting direction is not less than 1 μm.

16. The transistor according to claim 14, wherein
the fourth portion comprises a portion on a side of the gate insulating film, and
a resistivity of the portion of the fourth portion on the side of the gate insulating film is not more than $1.0 \times 10^5$ Ω·cm.

17. The transistor according to claim 14, wherein an oxygen concentration of the second channel protection film is higher than an oxygen concentration of the first channel protection film.

18. The transistor according to claim 14, wherein the semiconductor layer comprises an oxide comprising at least one selected from the group consisting of indium, gallium, and zinc.

\* \* \* \* \*